(12) United States Patent
Wieting

(10) Patent No.: US 8,008,198 B1
(45) Date of Patent: Aug. 30, 2011

(54) LARGE SCALE METHOD AND FURNACE SYSTEM FOR SELENIZATION OF THIN FILM PHOTOVOLTAIC MATERIALS

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 39 days.

(21) Appl. No.: 12/568,644

(22) Filed: Sep. 28, 2009

Related U.S. Application Data

(60) Provisional application No. 61/101,635, filed on Sep. 30, 2008.

(51) Int. Cl.
*H01L 21/44* (2006.01)

(52) U.S. Cl. ........ 438/687; 438/513; 438/509; 438/913; 257/E21.006; 257/E21.077; 257/E21.17; 257/E21.169; 257/E21.311

(58) Field of Classification Search .................. 438/509, 438/683, 687, 311, 678, 753, 513, 903, 913; 257/E21.17, E21.006, E21.077, E21.169, 257/E21.311
See application file for complete search history.

(56) References Cited

U.S. PATENT DOCUMENTS

| | | | | |
|---|---|---|---|---|
| 4,611,091 A | * | 9/1986 | Choudary et al. | 136/260 |
| 4,612,411 A | * | 9/1986 | Wieting et al. | 136/265 |
| 4,915,745 A | * | 4/1990 | Pollock et al. | 136/265 |
| 4,996,108 A | | 2/1991 | Divigalpitiya et al. | |
| 5,125,984 A | | 6/1992 | Kruehler et al. | |
| 5,261,968 A | | 11/1993 | Jordan | |
| 5,501,744 A | | 3/1996 | Albright et al. | |
| 5,536,333 A | | 7/1996 | Foote et al. | |
| 5,665,175 A | | 9/1997 | Safir | |
| 6,328,871 B1 | | 12/2001 | Ding et al. | |
| 2006/0220059 A1 | | 10/2006 | Satoh et al. | |
| 2007/0089782 A1 | | 4/2007 | Scheuten et al. | |
| 2007/0151596 A1 | | 7/2007 | Nasuno et al. | |
| 2007/0169810 A1 | | 7/2007 | Van Duren et al. | |
| 2008/0041446 A1 | | 2/2008 | Wu et al. | |
| 2008/0092945 A1 | | 4/2008 | Munteanu et al. | |
| 2008/0092953 A1 | | 4/2008 | Lee | |

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.
International Search Report & Written Opinion of PCT Application No. PCT/US 09/46161, date of mailing Jul. 27, 2009, 14 pages total.
International Search Report & Written Opinion of PCT Application No. PCT/US 09/46802, mailed on Jul. 31, 2009, 11 pages total.
Onuma et al., Preparation and Characterization of CuInS Thin Films Solar Cells with Large Grain, Elsevier Science B.V; Solar Energy Materials & Solar Cells 69 (2001) pp. 261-269.

* cited by examiner

*Primary Examiner* — David Nhu
(74) *Attorney, Agent, or Firm* — Kilpatrick Townsend & Stockton LLP

(57) ABSTRACT

A method for fabricating a copper indium diselenide semiconductor film is provided using substrates having a copper and indium composite structure. The substrates are placed vertically in a furnace and a gas including a selenide species and a carrier gas are introduced. The temperature is increased from about 350° C. to about 450° C. to initiate formation of a copper indium diselenide film from the copper and indium composite on the substrates.

36 Claims, 11 Drawing Sheets

LARGE SCALE METHOD AND FURNACE SYSTEM FOR SELENIZATION OF THIN FILM PHOTOVOLTAIC MATERIALS

CROSS-REFERENCES TO RELATED APPLICATIONS

This application claims priority to U.S. Provisional Patent Application No. 61/101,635, filed Sep. 30, 2008, entitled "LARGE SCALE METHOD AND FURNACE SYSTEM FOR SELENIZATION OF THIN FILM PHOTOVOLTAIC MATERIALS" by inventor Robert D. Wieting, commonly assigned and incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to photovoltaic techniques. More particularly, the present invention provides a method and structure for a thin film photovoltaic device using copper indium diselenide species (CIS), copper indium gallium diselenide species (CIGS), and/or others. The invention can be applied to photovoltaic modules, flexible sheets, building or window glass, automotive, and others.

In the process of manufacturing CIS and/or CIGS types of thin films, there are various manufacturing challenges, such as maintaining structure integrity of substrate materials, ensuring uniformity and granularity of the thin film material, etc. While conventional techniques in the past have addressed some of these issues, they are often inadequate in various situations. Therefore, it is desirable to have improved systems and method for manufacturing thin film photovoltaic devices.

BRIEF SUMMARY OF THE INVENTION

The present invention relates generally to photovoltaic techniques. More particularly, the present invention provides a method and structure for a thin film photovoltaic device using copper indium diselenide species (CIS), copper indium gallium diselenide species (CIGS), and/or others. The invention can be applied to photovoltaic modules, flexible sheets, building or window glass, automotive, and others.

According to an embodiment, the present invention provides a method for fabricating a copper indium diselenide semiconductor film. The method includes providing a plurality of substrates, each of the substrates having a copper and indium composite structure. The method also includes transferring the plurality of substrates into a furnace, each of the plurality of substrates provided in a vertical orientation with respect to a direction of gravity, the plurality of substrates being defined by a number N, where N is greater than 5. The method further includes introducing a gaseous species including a selenide species and a first carrier gas into the furnace and transferring thermal energy into the furnace to increase a temperature from a first temperature to a second temperature, the second temperature ranging from about 350° C. to about 450° C. to at least initiate formation of a copper indium diselenide film from the copper and indium composite structure on each of the substrates. The method additionally includes maintaining the temperature at about the second temperature for a period of time. The method also includes removing at least residual selenide species from the furnace. The method further includes introducing a sulfide species into the furnace. Also, the method includes holding the temperature at a predetermined level to allow the plurality of substrates to reach a predetermined level of temperature uniformity. The method includes increasing a temperature to a third temperature, the third temperature ranging from about 500° C. to 525° C. while the plurality of substrates are maintained in an environment including a sulfur species to extract out one or more selenium species from the copper indium diselenide film.

In an alternative embodiment, the present invention provides a method for fabricating a copper indium diselenide semiconductor film. The method includes transferring a plurality of substrates into a furnace. Each of the plurality of substrates is provided in a vertical orientation with respect to a direction of gravity. The plurality of substrates is defined by a number N, where N is greater than 5. Each of the substrates has at least a copper and indium composite structure. The method further includes introducing a gaseous species including a selenide species and a carrier gas comprising a nitrogen species into the furnace. Additionally, the method includes transferring thermal energy into the furnace to increase a temperature from a first temperature to a second temperature. The second temperature ranges from about 350° C. to about 450° C. to at least initiate formation of a copper indium diselenide film from the copper and indium composite structure on each of the substrates. Furthermore, the method includes selectively introducing additional carrier gas into the furnace to maintain a substantially uniform temperature profile within the furnace during transferring of the thermal energy or another process within the furnace.

It is to be appreciated that the present invention provides numerous benefits over conventional techniques. Among other things, the systems and processes of the present invention are compatible with conventional systems, which allow cost effective implementation. In various embodiments, the temperature control method maintains structure integrity of substrates while providing allows various reactions to occur. For example, substrates are allowed to stabilize at a relative degree of uniform temperature when being processed. There are other benefits as well.

DETAILED DESCRIPTION OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive, and others.

Figure 1:
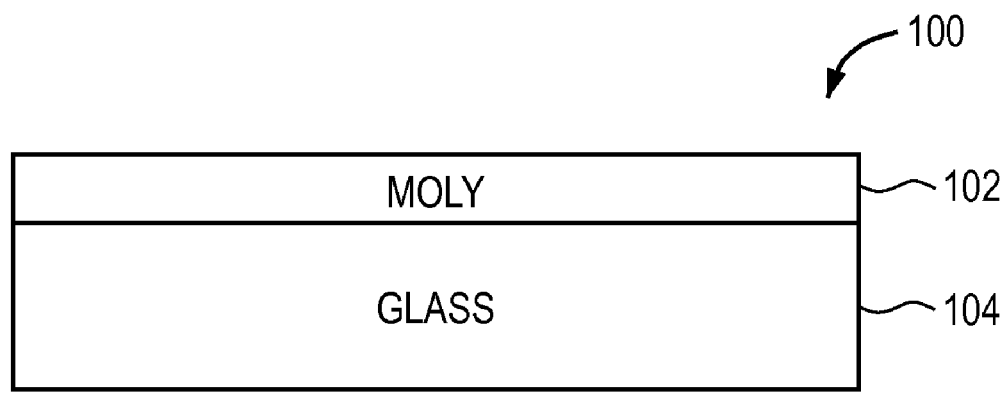
FIG. 1 is a simplified diagram of a transparent substrate with an overlying electrode layer according to an embodiment of the present invention.

FIG. 1 is a simplified diagram of a transparent substrate with an overlying electrode layer according to an embodiment of the present invention. This diagram is merely an example, which should not limit the scope of the claims herein. As shown, structure 100 includes a transparent substrate 104. In an embodiment, substrate 104 can be a glass substrate, for example, a soda lime glass. However, other types of substrates can also be used. Examples of substrates include borosilicate glass, acrylic glass, sugar glass, specialty Corning™ glass, and others. As shown, a contact layer comprising a metal electrode layer 102 is deposited upon substrate 104. According to an embodiment, the metal electrode layer 102 comprises metal material that is characterized by a predetermined conductivity that is optimized for thin-film based solar cell applications. Depending on the application, the metal electrode layer 102 may be deposited in various ways. For example, the metal electrode layer 102 comprises primarily a film of molybdenum that is deposited by sputtering. For example, the thickness may range form 200 to 700 nm. A sputtering apparatus, such as a DC magnetron sputtering apparatus, can be used to deposit a thin film of materials upon a substrate. Such apparatus is well known and commercially available. But it is to be understood that other types of equipments and/or processes, such as evaporation in vacuum based environment may be used as well. As an example, the sputtering deposition process is described below.

Sputter deposition is a physical vapor deposition (PVD) method of depositing thin films by sputtering, or ejecting, material from a "target", or source, which then deposits onto a substrate, such as a silicon wafer or glass. Sputtered atoms ejected from the target have a wide energy distribution, typically up to 10's of eV's (100000 K). The entire range from high-energy ballistic impact to low-energy thermalized motion is accessible by changing the background gas pressure. The sputtering gas is often an inert gas such as argon. For efficient momentum transfer, the atomic weight of the sputtering gas should be close to the atomic weight of the target, so for sputtering light elements neon is preferable, while for heavy elements krypton or xenon are used. Reactive gases can also be used to sputter compounds. The compound can be formed on the target surface, in-flight or on the substrate depending on the process parameters. The availability of many parameters that control sputter deposition make it a complex process, but also allow experts a large degree of control over the growth and microstructure of the film.

Figure 2:
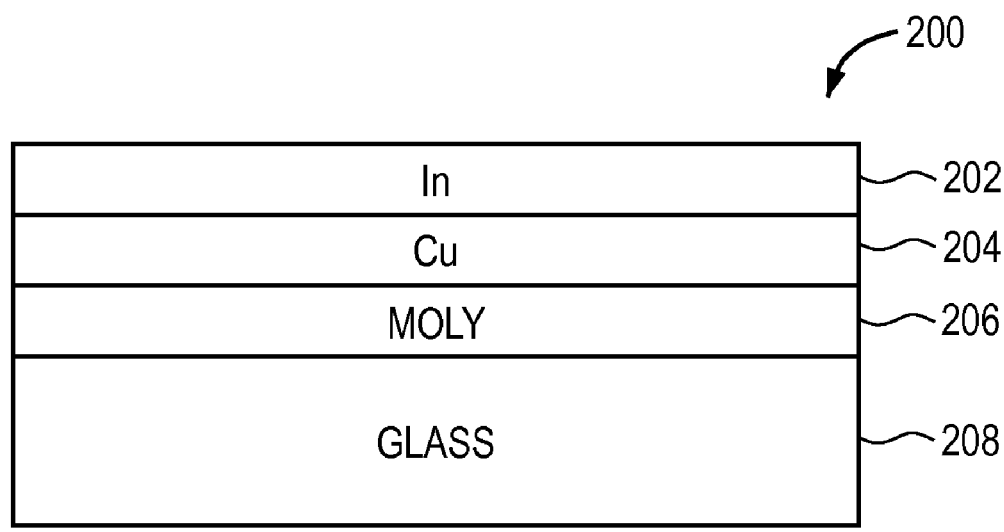
FIGS. 2 and 2A are simplified diagram of a composite structure including a copper and indium film according to an embodiment of the present invention.

FIG. 2 is a simplified diagram of a composite structure including copper and indium material according to an embodiment of the present invention. This diagram is merely an example, which should not limit the scope of the claims herein. In this embodiment, structure 200 is includes a glass substrate 208, preferably soda lime glass, which is about 1 to 3 millimeters thick. For example, the glass substrate 208 serves as a supporting layer. The metal layer 206 is deposited upon substrate 208. For example, the metal layer 206 serves as a metal electrode layer to provide electrical contact. For example, the layer 206 comprises primarily a film of molybdenum which has been deposited by sputtering to a thickness of from 200 to 700 nm. In a specific embodiment, an initial film of chromium is first deposited upon glass 208. For example, the chromium is used to insure good adhesion of the overall structure to the substrate 208. Other types of material may also be used in a barrier layer, such as silicon dioxide, silicon nitride, etc. Layers 204 and 202 include primarily a copper layer and an indium layer deposited upon metal layer 206 by a sputtering process.

As shown in FIG. 2, the indium layer overlays the copper layer. But it is to be understood that other arrangements are possible. In another embodiment, the copper layer overlays the indium layer. As an example, a sputtering apparatus, such as a DC magnetron sputtering apparatus, is used to deposit the thin film (e.g., layer 202, 204, and/or 206) of materials upon a substrate. It is to be appreciated that various types of sputtering apparatus may be used. Such apparatus is well known and commercially available. Other material can also be used. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 2) may be formed deposited in addition to the copper and indium material. According to an embodiment, the ratio between the copper and indium+gallium material is less than 1 (e.g., Cu/III<0.92~0.96, here III means group III); that is, less than one part of copper per one part of indium material.

Figure 2A:
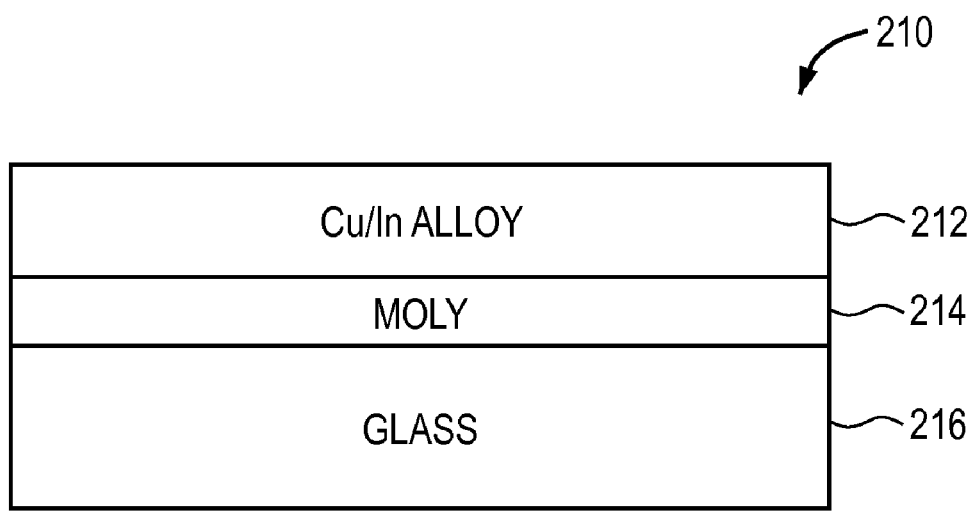

As an example, the structure 200 is formed by processing the structure 100. For example, the Cu and In are deposited onto the structure 100 to form the structure 200. As described, sputtering process is used for forming the copper and/or indium layer. In the embodiment illustrated in FIG. 2, the Cu film and the In film are shown as two separate layers. In another embodiment, a Cu/In composite or Cu/In alloy is formed during the sputtering process, as shown in FIG. 2A. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 2) may be formed deposited in addition to the copper and indium material FIG. 2A is a simplified diagram of a composite structure 210 including a copper and indium composite film according to another embodiment of the present invention. This diagram is merely an example, which should not limit the scope of the claims herein. As shown, the structure 210 includes a transparent substrate 216. In an embodiment, substrate 216 can be a glass substrate, for example, a soda lime glass. A back contact comprises a metal electrode layer 214 is deposited upon substrate 216. For example, the layer 214 comprises primarily a film of molybdenum material is deposited by sputtering. In a specific embodiment, an initial film of chromium is deposited upon glass 216 before depositing the molybdenum material to provide for good adhesion of the overall structure to the substrate 210. The layer 212 comprises primarily a copper (and gallium) indium alloy or copper (gallium) indium composite material. For example, the mixing or alloying of copper indium results in an improved homogeneity or advantageous morphology of the composite copper and indium film. This improved structure is carried over into the desired CIS film after the selenization step. According to an embodiment, a copper (or CuGa alloy) indium alloy material is formed from separate layers of copper (or CuGa alloy) material and indium material, which diffuse into each layer. For example, the process of forming of copper indium (or CuInGa) alloy material is performed by subjecting the structure to a high temperature annealing in an environment containing gaseous selenium species.

Figure 3:
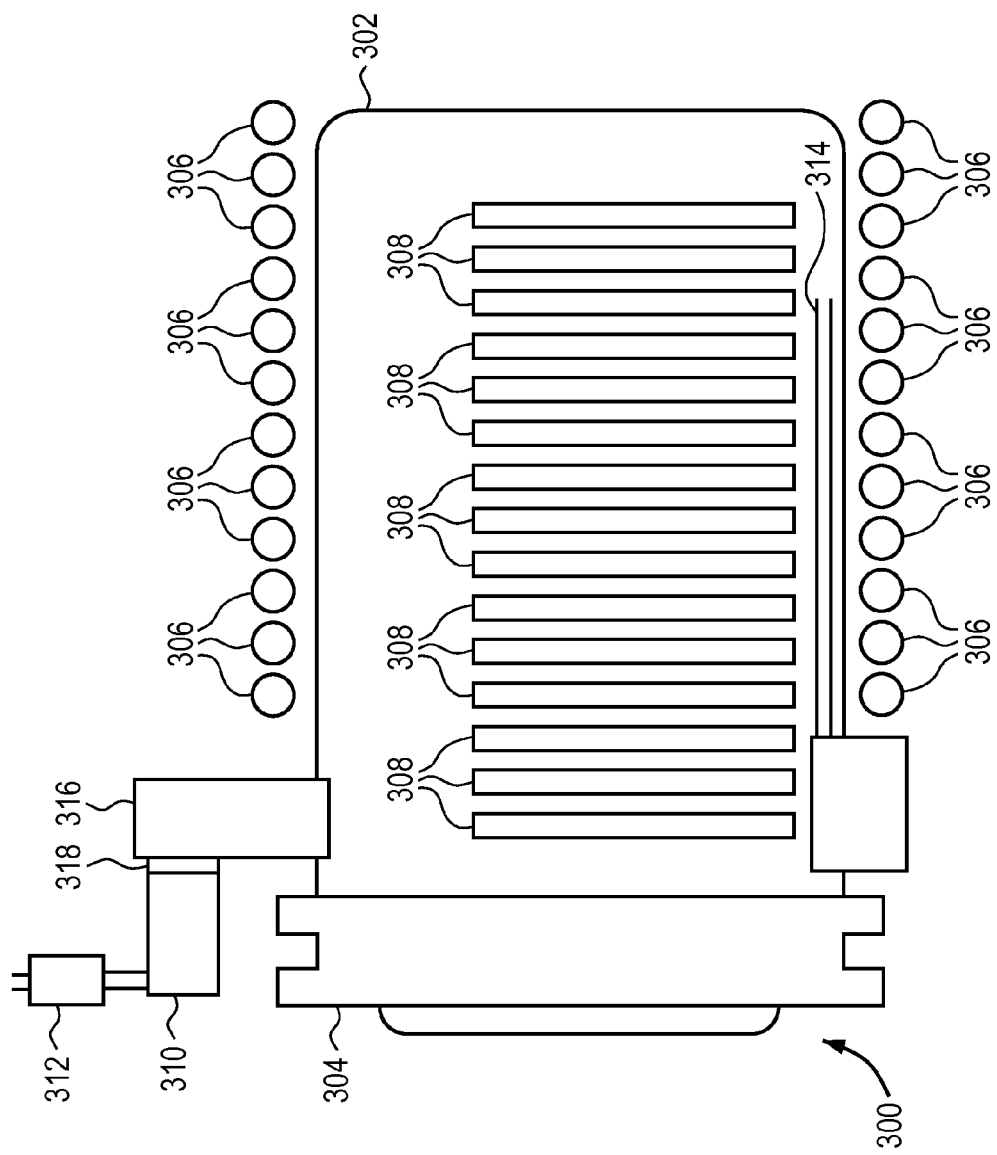
FIG. 3 is a simplified diagram of a furnace according to an embodiment of the present invention.

FIG. 3 is a simplified diagram of a furnace according to an embodiment of the present invention. This diagram is merely an example, which should not limit the scope of the claims herein. As shown, a furnace 300 includes a process chamber 302 and a chamber lid 304 According to an embodiment, the reaction chamber 302 is characterized by a volume of more than 200 liters. For example, typical volume for research related application is may be as low as a few liters, while the production furnace can increase a volume of over 2000 liters. As shown in FIG. 3, the furnace 300 includes a vacuum-pumping machine that comprises a turbo molecular pump 310 and a rotary pump 312. Depending on the application, the vacuum-pumping machine can be implemented by way of a combination of a mechanical booster pump and a dry pump. For example, the raw material gas and/or a diluting gas such as helium, nitrogen, argon, or hydrogen can be introduced in process chamber 302 via a gas injection pipe 314, if demanded by the specific applications and/or processes. The chamber 302 is evacuated by the turbo molecular pump 310 via the rotary pump 312 that is connected with a manifold 316 via a gate valve and a conductance valve 318. For example, there are no special partitions in the manifold or in the reaction furnaces. A heating element 306 is mounted outside the reaction chamber 302.

In a specific embodiment, the chamber lid 304 of the chamber is built with embedded temperature control elements. For example, the temperature control elements include lamps for generating heat and cooling water pipes for actual temperature control. The lid 304 also includes quartz baffles (not shown) that serves an element for controlling exchange of heat and mass (gases) between a main spatial region of the chamber 302 and a spatial region surrounding the lid 304. By controlling the lid temperature through the embedded elements and heat/mass flow through the baffles, the reactive chemistry in the main spatial region of the chamber, where the substrates with copper indium gallium composite film are loaded, is under controlled.

The furnace 300 can be used for many applications. According to an embodiment, the furnace 300 is used to apply thermal energy to various types of substrates and to introduce various types of gaseous species, among others. In an embodiment, one or more glass plates or substrates are positioned vertically near the center of chamber 302. In an alternative embodiment, these substrates may be placed vertically and parallel, or diagonal, or perpendicular to the chamber lid 304. Under certain conditions, the substrates may be loaded in a horizontal configuration if proper support is in place for preventing the warping of the large glass plates during the thermal treatment. Of course, the exact configuration varies with chamber design and processes. As an example, substrates 308 can be similar to those described in FIGS. 2 and 2A (e.g., Cu/In layers or composite Cu/In layer overlying a metal contact layer on a substrate). These layers placed in the process chamber in the presence of a gas containing selenium, such as hydrogen selenide $H_2Se$. After annealing the material for a given period of time, the copper, indium and selenium interdiffuse and react to form a high quality copper indium diselenide (CIS) film and/or CIGS film.

Figure 4:
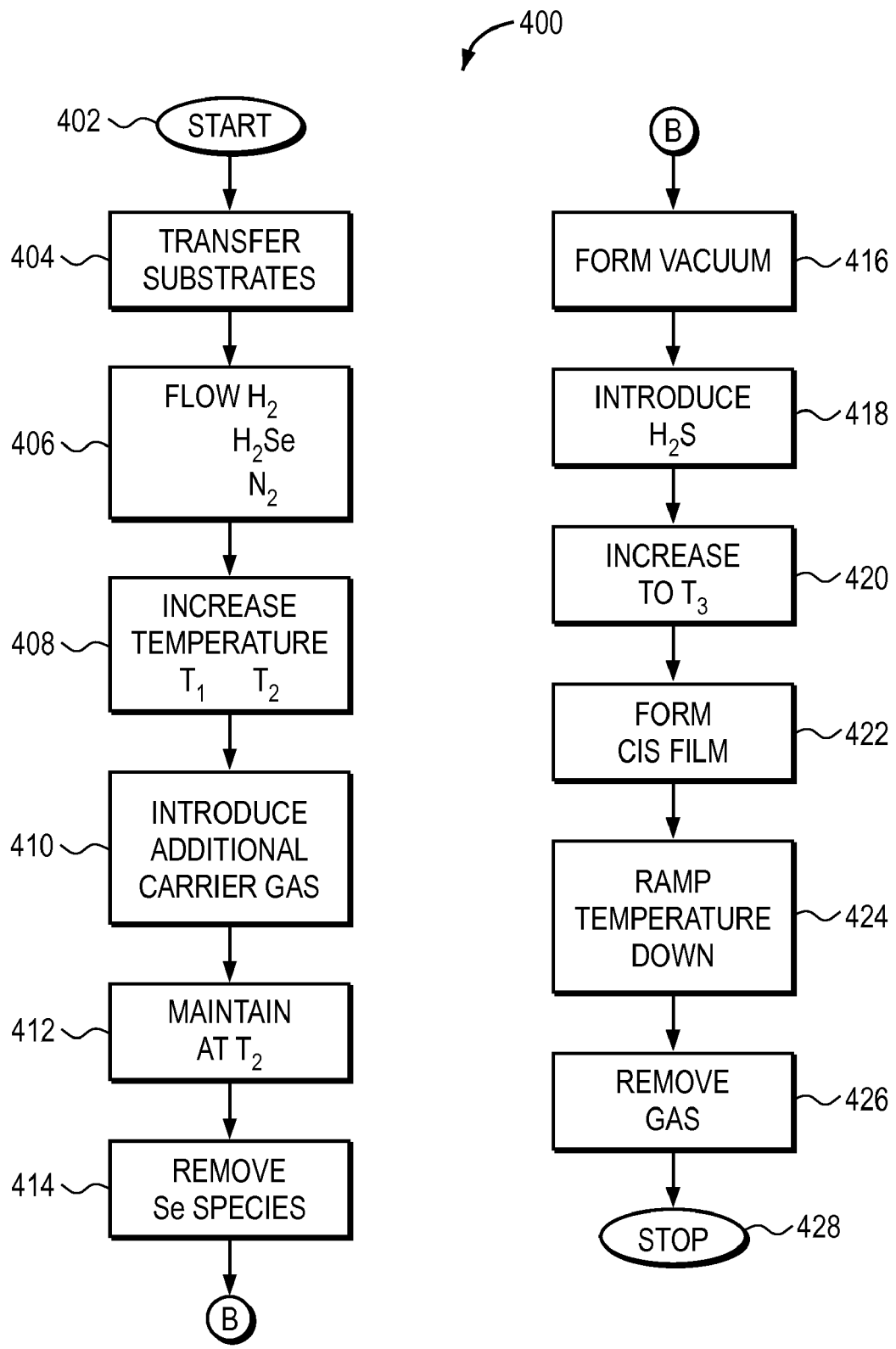
FIG. 4 is a simplified diagram of a process for forming a copper indium diselenide layer according to an embodiment of the present invention.

FIG. 4 is a simplified diagram of a process for forming a copper indium diselenide layer according to an embodiment of the present invention. This diagram is merely an example, which should not limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 4, the present method can be briefly outlined below.

1. Start;
2. Provide a plurality of substrates having a copper and indium composite structure
3. Introduce a gaseous species including a selenide species and a carrier gas into the furnace;
4. Transfer thermal energy into the furnace to increase a temperature from a first temperature to a second temperature;
5. Maintain the temperature at about the second temperature for a period of time;
6. Remove at least the residual selenide species from the furnace;
7. Form vacuum in the process chamber while maintaining the temperature for a predetermined time;
8. Introduce a sulfide species into the furnace during the predetermined time;
9. Increasing the temperature to a third temperature;
10. Increasing the temperature to a third temperature after a one or more predetermined conditions are met;
11. Ramp down the temperature from the third temperature to about the first temperature in a controlled manner;
12. Remove gas; and
13. Stop.

These steps are merely examples and should not limit the scope of the claims herein. One of ordinary skill in the art would recognize many other variations, modifications, and alternatives. For example, various steps outlined above may be added, removed, modified, rearranged, repeated, and/or overlapped, as contemplated within the scope of the invention. As shown, the method 400 begins at start, step 402. Here, the user of the method begins at a process chamber, such as the one noted above, as well as others. The process chamber can be maintained at about room temperature before proceeding with the present method.

A plurality of substrates is transferred into the process chamber, step 402. Each of the plurality of substrates can be provided in a vertical orientation with respect to gravity. The plurality of substrates can be defined by a number N, where N is greater than 5. The plurality of substrates can comprise 5 or more individual substrates. In another embodiment, the plurality of substrates can comprise 40 or more individual substrates. For example, each substrate can have a dimension of 65 cm to 165 cm or smaller. But it is understood that other dimensions are possible. Each of the substrates is maintained in substantially a planar configuration free from warp or damage. For example, if the substrates were provided in an orientation other than vertical with respect to gravity, the gravitational force could cause the substrates to sag and warp. This occurs when the substrate material reaches a softening temperature, compromising the structural integrity of the substrate. Typically, glass substrates, particular soda lime glass substrates, begin to soften at 480° C. In an embodiment, the substrates are also separate from one another according to a predetermined spacing to ensure even heating and reactions with gaseous species that are to be introduced to the furnace.

After the substrates are positioned into the process chamber, gaseous species, including a selenide species, and/or a carrier gas, are introduced into the process chamber in step 406. In an embodiment, the gaseous species includes at least $H_2Se$ and nitrogen. In another embodiment, the gaseous species other types of chemically inert gas, such as helium, argon, etc. For example, the substrates are placed in the presence of a gas containing selenium, such as $H_2Se$. In another embodiment, the gaseous species may be introduced after a period of time so that the substrate has been heated to a predetermined temperature in an inert atmosphere (e.g., with nitrogen or argon filled at least 70% of furnace volume).

The furnace is then heated up to a second temperature ranging from about 350° C. to 450° C. in step 408. The transfer of thermal energy for the purpose of heating the process chamber can be done by heating elements, heating coils, and the like. For example, step 408, among other things, at least starts the formation of a copper indium diselenide film by reactions between the gaseous species and the copper and indium composite (or layered) structure on each of the substrates. In a specific embodiment, separate layers of copper and indium material are diffused into each other to corm a single layer of copper indium alloy material. The second temperature is maintained for about 10 to 90 minutes at the heat treatment interval between 350° C. and 450° C., step 410. In another embodiment, the second temperature range can be from 390° C. to 410° C. For example, the period of time for maintaining the temperature at step 410 is provided to allow formation of the CIS and/or CIGS film material. As the temperature increases, the pressure inside the furnace may increase as well. In a specific embodiment, a pressure release valve is used to keep the pressure within the furnace at approximately 650 torr.

During the transferring of thermal energy or another process within the furnace, an additional carrier gas is selectively introduced into the furnace. Among other things, the carrier case functions as a filling gas to keep the total amount of gas in the furnace constant and also helps maintain a substantially uniform temperature profile within the process chamber, step 410. In a specific embodiment, the additional carrier gas can comprise of nitrogen gas $N_2$. For example, other types of chemically inert gas may be used as the additional carrier gas, such as helium, argon, carbon dioxide, among others. In yet another specific embodiment, the additional carrier gas can be used to cool the furnace while maintaining a uniform temperature profile within the process chamber. For example, if the forming of the CIS and/or CIGS film were to occur in a non-uniform temperature profile, the resulting film would be non-uniform across the substrates. For example, the temperature distribution within a process chamber in a vacuum has variations and is unpredictable. By selectively introducing just enough of an additional carrier gas, such as nitrogen gas, the temperature profile of within the process chamber can be stabilized without substantially altering the reaction chemistry. According to various embodiments, the nitrogen gas is introduced at a predetermined concentration level. For example, the concentration level of nitrogen gas is dependent on the concentration level of other gas. For the purpose of temperature control/stabilization, various types of devices may be used in conjunction with or as a part of the furnace for the purpose of transferring the carrier gas into the furnace, in which the concentration, rate of transfer, time of injection, and/or other parameters can be controlled to ensure optimum results.

As the temperature is maintained at the second temperature (step 410) or at least when the temperature above certain threshold, the removal of the residual selenide species begins, in step 412. A vacuum is formed in the process chamber through a vacuum pump, in step 414. Once the vacuum is created in the process chamber (step 414), a sulfide species is introduced, in step 416, while the furnace temperature is held constant for a predetermined period of time to allow the substrate reaches its desired temperature. In a specific embodiment, the residual selenide removal process may continue until the process chamber is in vacuum configuration. After the gas ambient in the furnace has been changed such that the selenide species is removed and the hydrogen sulfide species is introduced, a second temperature ramp up process is initiated, step 418. But, an optional step may include waiting before the temperature is ramped up to allow the temperature uniformity to improve for all substrates in the main spatial region of the chamber. In a specific embodiment, the sulfide species is introduced with nitrogen. The nitrogen gas acts as a carrier gas occupying approximately 70 to 75% of the furnace.

For reaction between the substrate and the sulfur species to occur, the temperature of the substrates needs to be increased. In various embodiments, the temperature uniformity of the substrates is allowed to stabilize before the reaction with sulfur species takes place. For example, the stabilized temperature of the substrates allow for better uniformity thin film overlaying the substrates as well as the structure integrity of the substrates themselves. In a specific embodiment, the temperature of the furnace at this point is only allowed to increase if one or more preconditions are met. For example, the precondition includes that the temperature difference of different regions of a substrate can be as small as about 20° C. In a specific embodiment, a specific calibrated stabilization period is used. Once it is determined that substrates has reached a level of temperature uniformity, the temperature of the furnace is increased to a third temperature ranging from about 500° C. to 525° C. For example, the third temperature is calibrated for reaction between the hydrogen sulfide species and the substrates in furnace.

At step 420, temperature is maintained at the third temperature for a period of time until the formation of the copper indium diselenide CIS (or CIGS if gallium is included) layer is completed. The step is set up for the purpose of extracting out one or more selenium species from the copper indium diselenide film in the ambient of the furnace comprising the sulfur species. It is to be appreciated that a predetermined amount of selenium are removed. In a specific embodiment, approximately 5% of the selenium is removed from the CIS film and is replaced by about 5% of sulfur. According to an embodiment, a complete reaction between the selenium with the CIS film is desired. After the removal of residual selenium, a controlled temperature ramp down process is initiated, in step 422. The furnace is cooled to the first temperature of about room temperature, and the remaining gaseous species are removed from the furnace, in step 424. For example, the gaseous species are removed by a vacuum pumping machine. The temperature sequence described above can be illustrated in the temperature profile in FIG. 5.

After step 420, additional steps may be performed depending on the desired end product. For example, if a CIS or CIGS type of thin-film solar cell is desired, additional processes are provided to provide additional structures, such as a transparent layer of material such as ZnO overlaying the CIS layer.

It is also understood that the examples and embodiments described herein are for illustrative purposes only and that various modifications or changes in light thereof will be suggest to persons skilled in the art and are to be included within the spirit and purview of this application and scope of the appended claims.

Depending on the application, the introduction of an additional carrier gas, step 410, can be conducted during any of the steps previously mentioned and any other process. For example, other processes may include process involving the change of temperature, introduction and removal of gaseous species, change in flow rate of gaseous species, change in pressure of the process chamber, or the manipulation of any other parameter. These steps are merely examples and should not limit the scope of the claims herein. One of ordinary skill in the art would recognize many other variations, modifications, and alternatives. For example, various steps outlined above may be added, removed, modified, rearranged, repeated, and/or overlapped, as contemplated within the scope of the invention.

It is also understood that the examples and embodiments described herein are for illustrative purposes only and that various modifications or changes in light thereof will be suggest to persons skilled in the art and are to be included within the spirit and purview of this application and scope of the appended claims.

Figure 5:
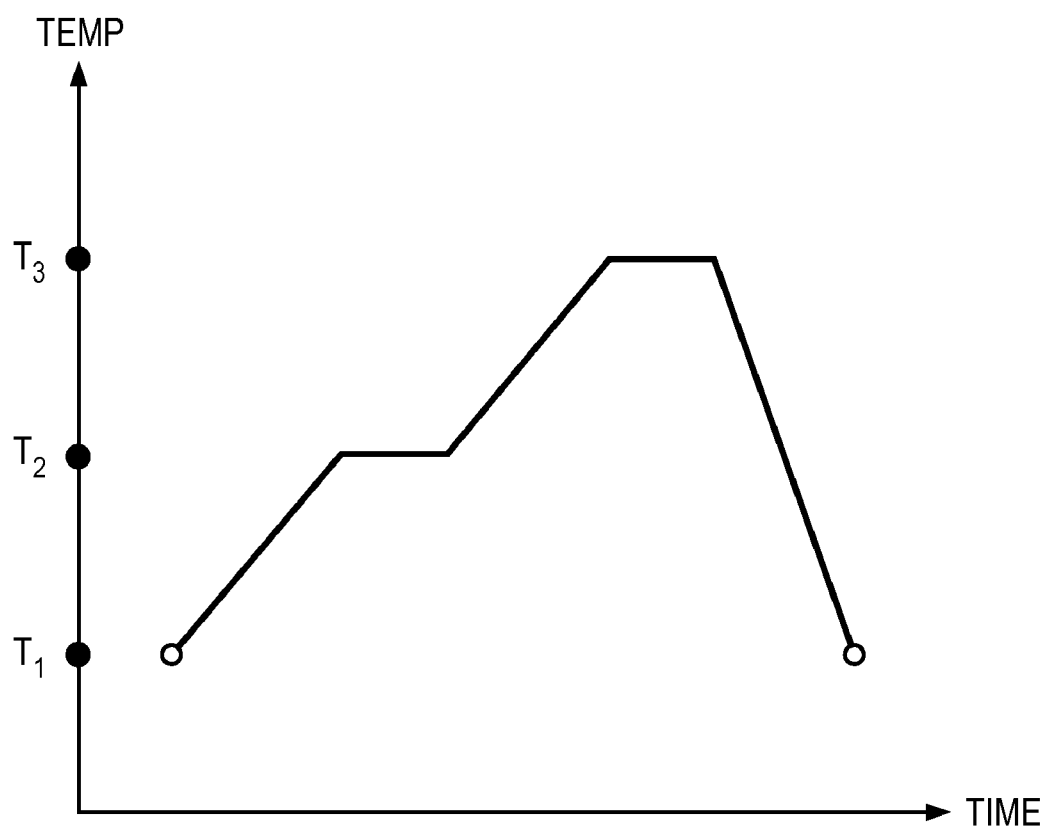
FIGS. 5 and 5A are simplified diagrams of a temperature profile of the furnace according to an embodiment of the present invention.

FIG. 5 is a simplified diagram of a temperature profile of the furnace according to an embodiment of the present invention. This diagram is merely an example, which should not limit the scope of the claims herein. The temperature profile further details the temperature ramping process in the above-described method outline (FIG. 4) and specification. An optimized temperature profile (FIG. 5) is provided to illustrate a heating process according to an embodiment of the present invention. The optimized profile regulates the process chamber in order to prevent the warping of large substrates at high temperatures. If the temperature is ramped up too high too quickly, warping or damage may occur due to the softening of glass. In addition, the total amount of thermal energy is determined in consideration of total thermal budget available to the substrates and to maintain the uniformity and structure integrity of the glass substrate. For example, by periodically controlling the temperature of the heating process in steps, the substrate stays at a level of stabilization and relaxing in which the requisite structure integrity is maintained. As explained above, material such as glass tends to deform at a temperature of 480° C. or higher, and thus caution is exercised to avoid prolong exposure of substrate at high temperatures.

Referring to FIG. 5, while the ambience of a process chamber is maintained with a gaseous species including a selenide species and a carrier gas, a plurality of substrates is put into the furnace. The plurality of substrates is provided in a vertical orientation with respect to a direction of gravity, with the plurality of substrates being defined by a number N, where N is greater than 5. In certain implementation, the number N is greater than 40. In an embodiment, the substrates include glass substrates, such as soda lime glass. The furnace starts the process with a first temperature of about 30° C. (i.e., around room temperature). The furnace of course can start with a higher temperature, such as 100° C. The furnace is then heated up to a second temperature ranging from about 350° C. to 450° C.

The second temperature is maintained for 10 to 60 minutes at the heat treatment interval between 350° C. to 450° C. The size of glass substrate can be 20 cm×20 cm up to 65 cm×165 cm. A challenge in processing large substrate is the warping of the substrate at high temperatures. For reaction between the substrate and the sulfur species to occur, the temperature of the substrates needs to increases. In various embodiments, the temperature uniformity of the substrates is allowed to stabilize before the reaction with sulfur species takes place. For example, the stabilized temperature of the substrates allow for better uniformity thin film overlaying the substrates as well as the structure integrity of the substrates themselves. In a specific embodiment, the temperature of the furnace at this point is only allowed to increase if one or more preconditions are met. For example, the precondition includes that the temperature difference of different regions of a substrate is as small as about 20° C. In a specific embodiment, a specific calibrated stabilization period is used. Once it is determined that substrates has reached a level of temperature uniformity, the temperature of the furnace is increased to a third temperature ranging from about 500° C. to 525° C. For example, the third temperature is calibrated for reaction between the sulfide species and the substrates in furnace. If the temperature is ramped up directly to T3, warping or damage may occur. As shown, the slope of ramping up from T2 to T3 is calibrated to reduce and/or eliminate the risk of damaging the substrate. By maintaining the temperature in the process chamber at T2 for a period of time, the substrate can relax and stabilize. The maintaining time at this interval is set up according to the purpose of at least initiating formation of the copper indium diselenide film from the copper and indium composite structure on each of the substrates.

While the second temperature is maintained, the ambient of the furnace is changed such that the selenide species is removed and a sulfide species is introduced.

After the gas ambience in the furnace has been changed such that the selenide species is removed and the sulfide species is introduced, a second temperature ramp up process is initiated. In this process, the temperature of the furnace is increased to a third temperature ranging from about 500° C. to 525° C.

After the temperature ramp-up process, the temperature of the furnace is maintained for 10 to 60 minutes at the heat treatment interval between 500° C. and 525° C. The time interval with the temperature in a plateau in an ambient comprising a sulfur species, e.g., hydrogen sulfide gas, is set up for the purpose of extracting out one or more selenium species from the copper indium diselenide film. In particular, the residual selenide species can be thermally cranked or decomposed to elemental selenium particles, which can be carried away by a convective current from relative hot main spatial region of the chamber to a relative cold region such as the chamber lid. Additionally, an exchange reaction occurs to replace sulfur species for the selenium species in the film overlying the substrate. As explained above, a predetermined amount (e.g., 5 to 10%) of selenium can be extracted to provide a proper amount of selenium concentration within the CIS film.

After partial replacement of selenium by sulfur, a controlled temperature ramp-down process is initiated, as the furnace is then cooled to the first temperature of about room temperature. According to an embodiment, the cooling process is specifically calibrated. As a result of this process, the copper, indium, and selenium interdiffuse and react to form a high quality copper indium diselenide film.

Figure 5A:
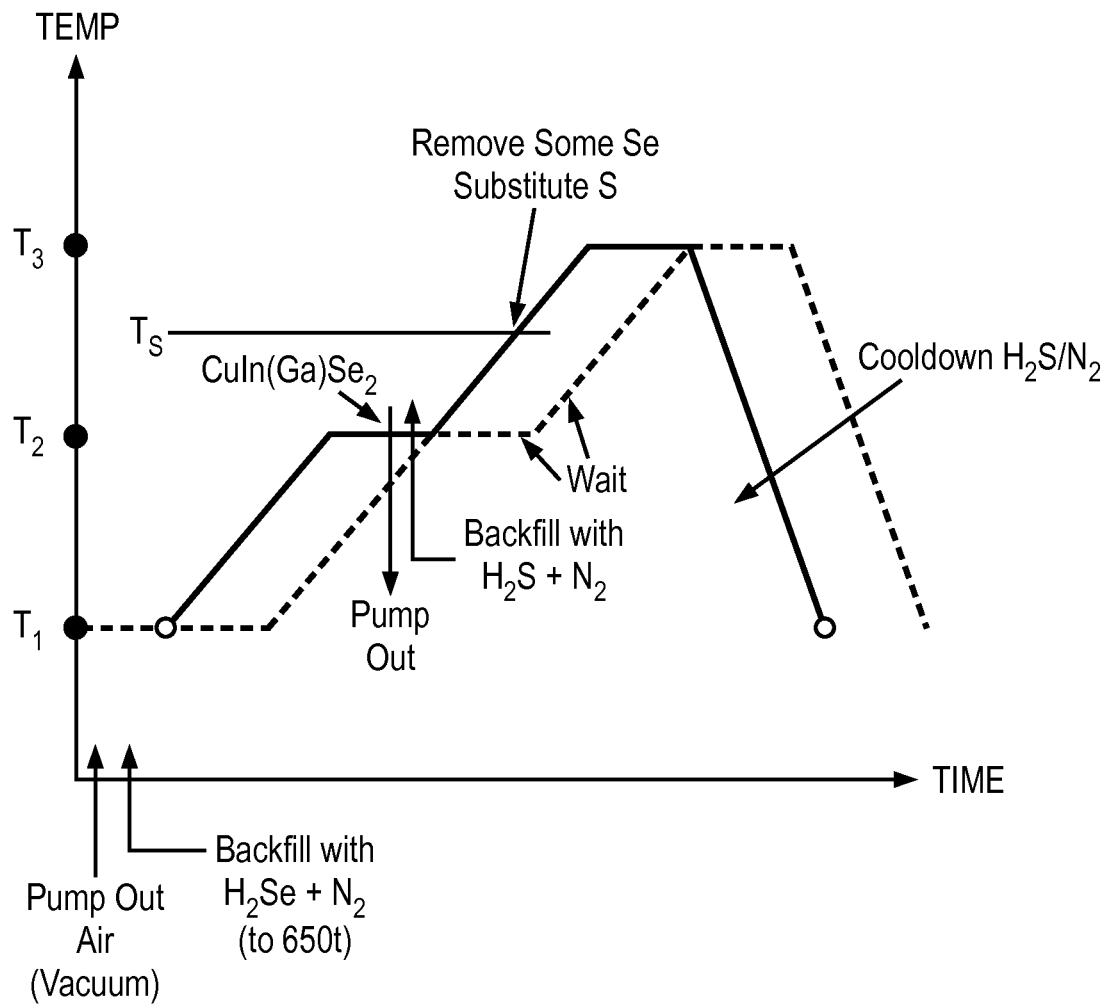

FIG. 5A is a simplified diagram of a temperature profile of the furnace according to an embodiment of the present invention. This diagram is merely an example, which should not limit the scope of the claims herein. The temperature profile further details the temperature ramping process in the above-described method outline (FIG. 4) and specification. An optimized temperature profile (FIG. 5A) is provided to illustrate a heating process according to an embodiment of the present invention.

As shown in FIG. 5A, T1 is approximately at room temperature. At this temperature, substrates are loaded into a furnace. Air is pumped out (e.g., by vacuum device) from the furnace, and $H_2Se$ and $N_2$ gas species are introduced into the furnace. For example, these gas species are introduced to the furnace so that at pressure of approximate 650 torr is reached.

Next temperature increases from T1 to T2 inside the furnace. For example, the rate of temperature ramping up is optimized to allow the relative uniform reaction between selenium and copper and indium (and possibly with addition of gallium). According to embodiments, the T2 temperature is approximately between 350° C. and 450° C. For example, the furnace stays at the T2 temperature for about 10 to 60 minutes. The time staying at the T2 temperature is to allow for reaction between selenium and copper indium material. In a specific embodiment, separate layers of copper and indium material form copper indium alloy while reacting with selenium material. As shown, CIS and/or CIGS material is formed at T2. During the temperature ramping up process, the pressure inside the furnace is controlled to sustain a relative uniform pressure level of approximate 650 torr. For example, a gas escape valve is used to release gases when the furnace heat up, where pressure increases due to gas expansion at high temperature.

After the CIS or CIGS material forms, various gaseous species are again pumped out from the furnace. Then, a sulfide gas along with inert gases (e.g., nitrogen, argon, helium, etc.) is introduced to the furnace, and the temperature inside the furnace increases from T2 to T3. As explained above, for reaction between the substrate and the sulfur species to occur, the temperature of the substrates needs to increases. In various embodiments, the temperature uniformity of the substrates is allowed to stabilize before the reaction with sulfur species takes place. For example, the stabilized temperature of the substrates allow for better uniformity thin film overlaying the substrates as well as the structure integrity of the substrates themselves. In a specific embodiment, the temperature of the furnace at this point is only allowed to increase if one or more preconditions are met. For example, the precondition includes that the temperature difference of different regions of a substrate is as small as about 20° C. In a specific embodiment, a specific calibrated stabilization period is used. Once it is determined that substrates has reached a level of temperature uniformity, the temperature of the furnace is increased to a third temperature ranging from about 500 to 525° C. For example, the third temperature is calibrated for reaction between the hydrogen sulfide species and the substrates in furnace. For example, T3 is approximately 500 to 550 degrees Celsius. In a specific embodiment, the temperature stays at T3 to allow the sulfide gas to interact with the CIGS and/or CIS material. For example, the sulfur replaces approximately 3 to 10% of the selenium from the CIGS and/or CIS material. After the reaction, the furnace is cools down in the ambient of sulfide gas which is removed at last.

Figure 7:
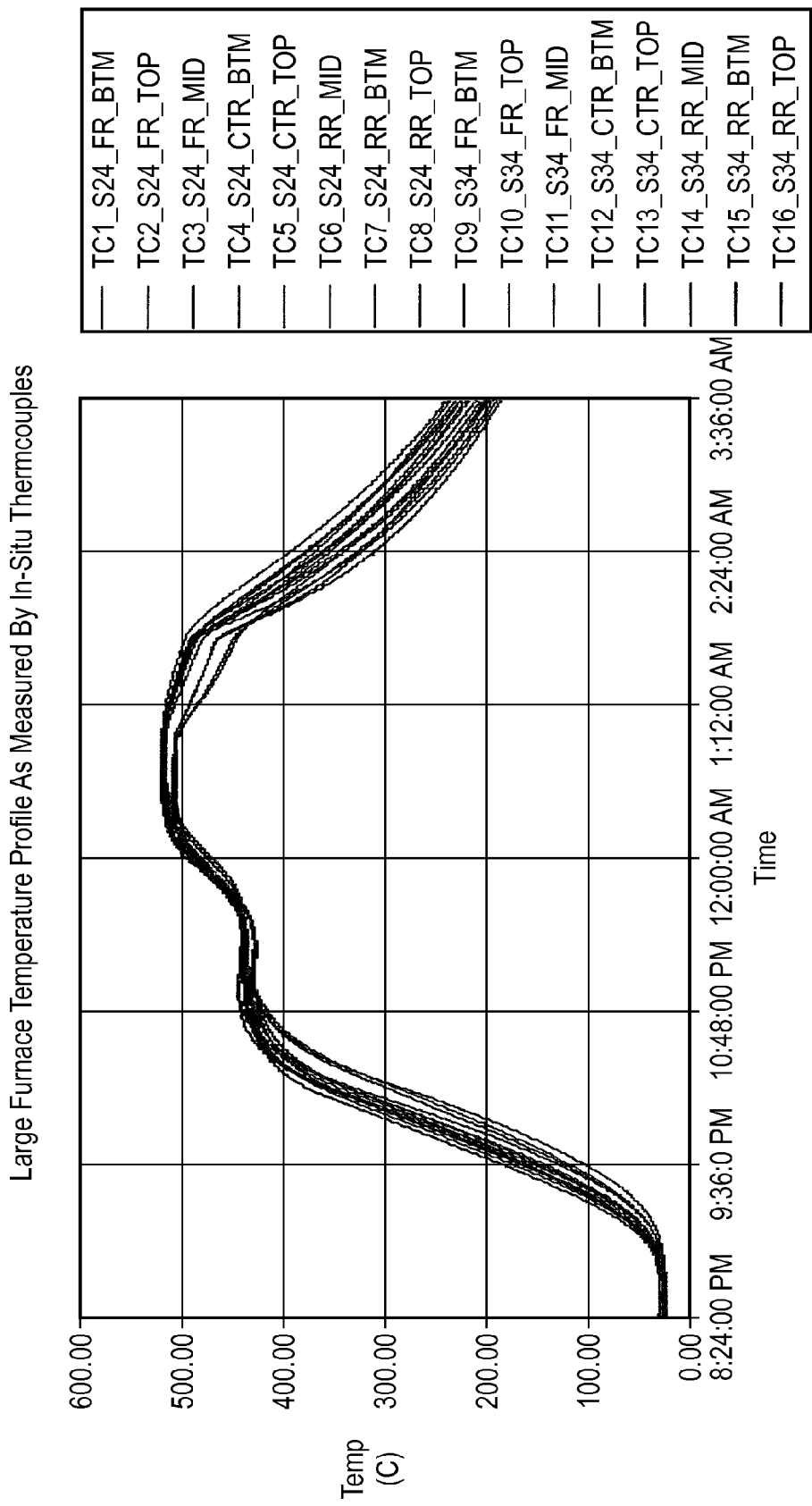
FIG. 7 shows exemplary furnace temperature profiles measured by in-situ thermal couples according to an embodiment of the present invention.

FIG. 7 shows exemplary furnace temperature profiles measured by in-situ thermal couples according to an embodiment of the present invention. This diagram is merely an example, which should not limit the scope of the claims herein. As shown, a large furnace is chosen to be the process chamber where a plurality of substrates has been loaded. In one embodiment, temperature sensors are pre-installed for monitoring all substrates on bottom, middle, and top regions. FIG. 7 shows the measured temperature profile during an actual processing run. It schematically illustrates realization of the temperature profile preset in FIG. 5 or FIG. 5A. Of course there can be many variations, modifications, and alternatives.

Figure 8:
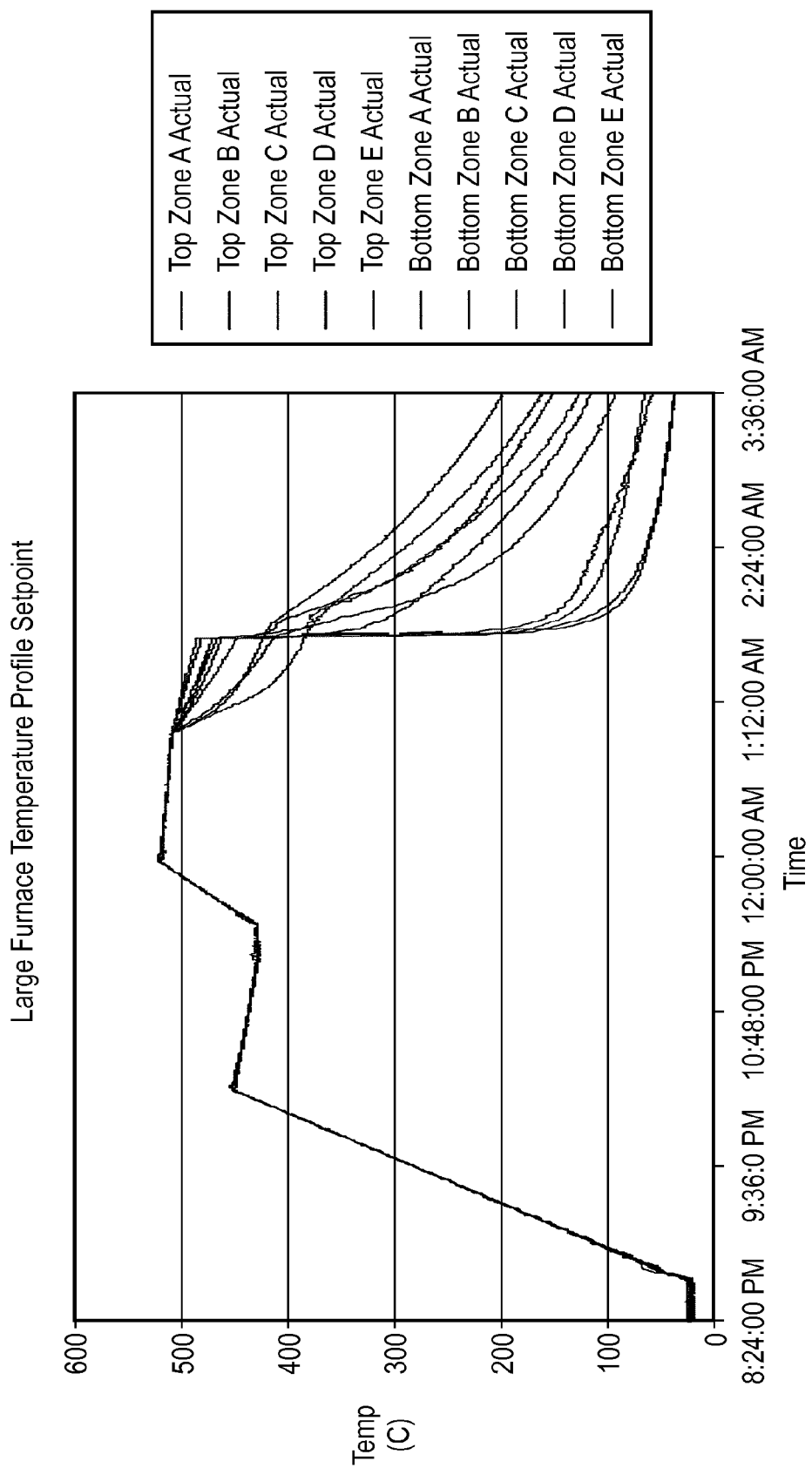
FIG. 8 shows exemplary temperature profile set points at various zones in a furnace according to an embodiment of the present invention.

In an embodiment, the furnace temperature profile, as seen in FIG. 7, is controlled by adjusting the heaters surrounding the process chamber. Additionally, depending on the internal structural design and substrate configuration when loaded in the substrate holder or boat, the temperature distribution may not be uniform. In fact, several temperature zones can be identified through experiment. Therefore, the temperature profile set point for corresponding zones can be separately controlled in order to achieve an actual temperature profile with improved uniformity. FIG. 8 just shows exemplary temperature profile set points at various zones in a furnace according to an embodiment of the present invention.

Figure 9:
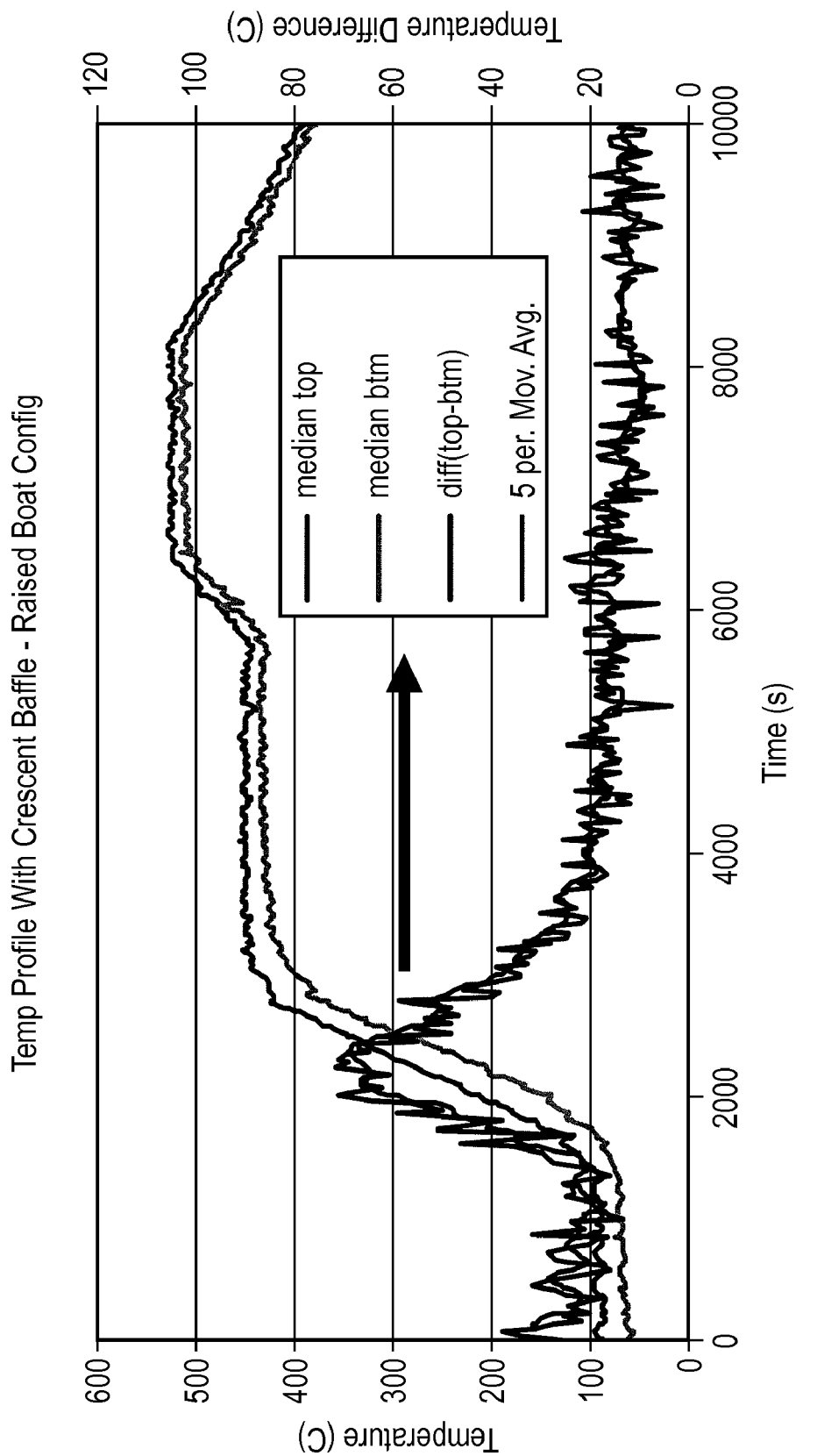
FIG. 9 shows an exemplary furnace temperature profile and substrate temperature uniformity according to an embodiment of the present invention.

For achieving desired cell performance for such large sized substrate (e.g., 65 cm×165 cm), controlling the process with improved temperature uniformity is important. As mentioned above, identifying various temperature zones in the furnace for setting independent temperature control is one method. Other methods of improving temperature uniformity include designing proper internal structural arrangement and substrate loading configuration. For example, adding certain baffles inside furnace's inner surface can partially isolate main processing zone for achieving better temperature uniformity and controlling the internal convective flow. Adding temperature control elements to an end cap (or lid) so that it can act as a "cryopump" inside the process chamber for reducing contamination and enhancing chemistry control of the reactive annealing of the film on substrate. FIG. 9 shows exemplary furnace temperature profile and substrate temperature uniformity according to an embodiment of the present invention. This diagram is merely an example, which should not limit the scope of the claims herein. As shown, the temperature uniformity, described by a temperature difference from bottom to top of the substrate, can be substantially improved by adding certain structural baffle to the furnace internal surface and adjusting the substrate position in the substrate loading boat. Of course, there can be many variations, modifications, and alternatives.

Figure 6A:
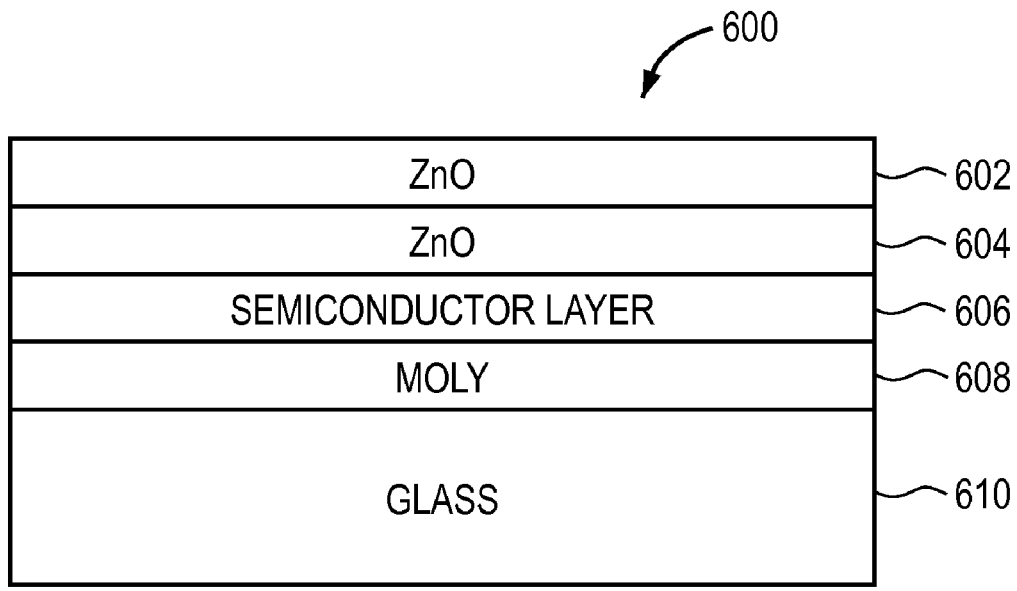
FIGS. 6A and 6B are simplified diagrams of a thin film copper indium diselenide device according to different embodiments of the present invention.

FIG. 6A is a simplified diagram of a thin film copper indium diselenide device according to an embodiment of the present invention. This diagram is merely an example, which should not limit the scope of the claims herein. As shown, structure 600 is supported on a glass substrate 610. According to an embodiment, the glass substrate comprises soda lime glass, which is about 1 to 3 millimeters thick. A back contact including a metal layer 608 is deposited upon substrate 610. According to an embodiment, layer 608 comprises primarily a film of molybdenum which has been deposited by sputtering. The first active region of the structure 600 comprises a semiconductor layer 606. In an embodiment, the semiconductor layer includes p-type copper indium diselenide (CIS) material. It is to be understood that other the semiconductor layer may include other types of material, such as CIGS. The second active portion of the structure 600 comprises layers 604 and 602 of n-type semiconductor material, such as CdS or ZnO. FIG. 6A shows the second active portion of the structure 600 comprising two CdS layers 602 and 604 with different levels of resistivity. Another embodiment is shown in FIG. 6B, in which the second active portion of the structure comprises both a CdS layer and a ZnO layer.

Figure 6B:
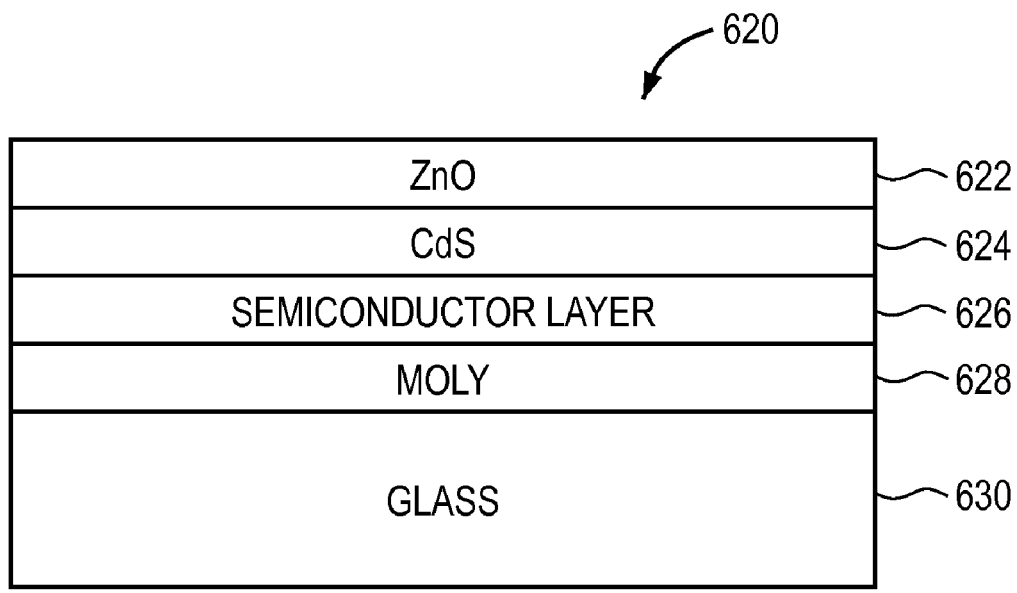

FIG. 6B is a simplified diagram of a thin film copper indium diselenide device according to another embodiment of the present invention. This diagram is merely an example, which should not limit the scope of the claims herein. As shown, structure 620 is supported on a glass substrate 630. According to an embodiment, the glass substrate comprises soda lime glass, which is about 1 to 3 millimeters thick. A back contact including a metal layer 628 is deposited upon substrate 630. According to an embodiment, layer 628 comprises primarily a film of molybdenum which has been deposited by sputtering. The first active region of the structure 620 comprises a semiconductor layer 626. In an embodiment, the semiconductor layer includes p-type copper indium diselenide (CIS) material. It is to be understood that other the semiconductor layer may include other types of material, such as CIGS. The second active portion of the structure 620 comprises layers CdS 624 and ZnO 622 of n-type semiconductor material.

A photovoltaic cell, or solar cell, such as device 600 described above, is configured as a large-area p-n junction. When photons in sunlight hit the photovoltaic cell, the photons may be reflected, pass through the transparent electrode layer, or become absorbed. The semiconductor layer absorbs the energy causing electron-hole pairs to be created. A photon needs to have greater energy than that of the band gap in order to excite an electron from the valence band into the conduction band. This allows the electrons to flow through the material to produce a current. The complementary positive charges, or holes, flow in the direction opposite of the electrons in a photovoltaic cell. A solar panel having many photovoltaic cells can convert solar energy into direct current electricity.

Semiconductors based on the copper indium diselenide (CIS) configuration are especially attractive for thin film solar cell application because of their high optical absorption coefficients and versatile optical and electrical characteristics. These characteristics can in principle be manipulated and tuned for a specific need in a given device. Selenium allows for better uniformity across the layer and so the number of recombination sites in the film are reduced which benefits the quantum efficiency and thus the conversion efficiency.

The present invention provides methods for making CIS-based and/or CIGS-based solar cells on a large glass substrate for a solar panel. The devices structure described in FIGS. 6A and/or 6B can be patterned into individual solar cells on the glass substrate and interconnected to form the solar panel. A cost-effective method for making thin film solar cell panel.

Figure 10:
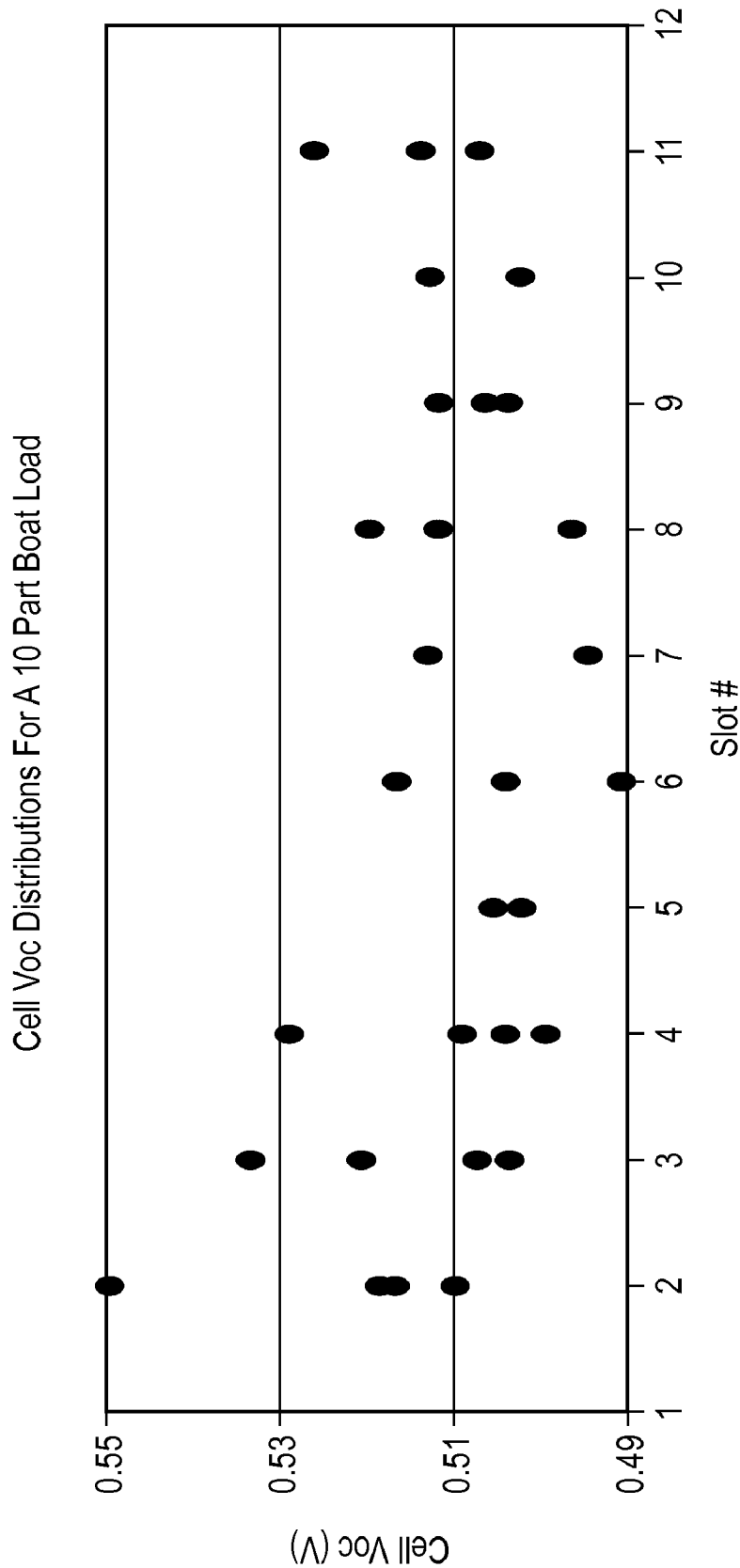
FIG. 10 shows an exemplary cell open-circuit voltage distribution from ten substrates in a furnace according to an embodiment of the present invention.

FIG. 10 shows an exemplary cell open-circuit voltage distribution from ten substrates in a furnace according to an embodiment of the present invention. This diagram is merely an example, which should not limit the scope of the claims herein. As shown, ten soda lime glass substrates have been loaded into a furnace described above and been carried out a series of large scale selenization and sulfurization processes for forming a CIS based photovoltaic absorber film. As the results, eventually the photovoltaic cells made from these films are tested on their IV characteristics. A key parameter, cell open-circuit voltages Voc, is measured around 0.5 V for cells made from those films out of the 10 substrates. FIG. 10 just shows that the Voc value distribution has achieved desired uniformity across all substrates in this large scale production process.

It will be appreciated that all of the benefits of the present invention can be achieved regardless of the order of deposition of the copper and indium films. That is, the indium could be deposited first or the films could be deposited as a sandwich or stack of thinner layers.

It is also understood that the examples and embodiments described herein are for illustrative purposes only and that various modifications or changes in light thereof will be suggest to persons skilled in the art and are to be included within the spirit and purview of this application and scope of the appended claims. Although the above has been generally described in terms of a specific structure for CIS and/or CIGS thin film cells, other specific CIS and/or CIGS configurations can also be used, such as those noted in issued U.S. Pat. Nos. 4,611,091 and 4,612,411, which are hereby incorporated by reference herein, without departing from the invention described by the claims herein.

What is claimed is:

1. A method for fabricating a copper indium diselenide semiconductor film comprising:
   providing a plurality of substrates, each of the substrates having a copper and indium composite structure;
   transferring the plurality of substrates into a furnace, each of the plurality of substrates provided in a vertical orientation with respect to a direction of gravity, the plurality of substrates being defined by a number N, where N is greater than 5;
   introducing a gaseous species including a selenide species and a first carrier gas into the furnace and transferring thermal energy into the furnace to increase a temperature from a first temperature to a second temperature ranging from about 350° C. to about 450° C. to at least initiate formation of a copper indium diselenide film from the copper and indium composite structure on each of the substrates;
   maintaining the temperature at about the second temperature for a period of time;
   removing at least residual selenide species from the furnace;
   introducing a sulfide species into the furnace;
   holding the temperature at a predetermined level to allow the plurality of substrates to reach a predetermined level of temperature uniformity; and
   increasing a temperature to a third temperature, the third temperature ranging from about 500° C. to 525° C. or greater while the plurality of substrates are maintained in an environment including a sulfur species to extract at least one selenium species from the copper indium diselenide film.

2. The method for fabricating a copper indium diselenide semiconductor film according to claim 1 wherein a second carrier gas is introduced during the period of time.

3. The method for fabricating a copper indium diselenide semiconductor film according to claim 2 wherein the second carrier gas comprises at least nitrogen.

4. The method for fabricating a copper indium diselenide semiconductor film according to claim 2 wherein the first carrier gas and the second carrier gas include essentially the same species.

5. The method for fabricating a copper indium diselenide semiconductor film according to claim 2 further comprising removing the second carrier gas after the period of time.

6. The method for fabricating a copper indium diselenide semiconductor film according to claim 1 wherein the predetermined level of temperature uniformity is characterized by a less than 5% temperature difference between different areas of a single substrate.

7. The method for fabricating a copper indium diselenide semiconductor film according to claim 1 wherein the predetermined level of temperature uniformity is characterized by 25 degrees Celsius temperature difference or less between different areas of a single substrate.

8. The method for fabricating a copper indium diselenide semiconductor film according to claim 1 further comprising a step of evaporating the copper material on the substrates.

9. The method for fabricating a copper indium diselenide semiconductor film according to claim 1 wherein the second temperature ranges from about 380° C. to about 460° C.

10. The method for fabricating a copper indium diselenide semiconductor film according to claim 1 wherein the first temperature ranges from room temperature to about 100° C.

11. The method for fabricating a copper indium diselenide semiconductor film according to claim 1 wherein the second temperature is maintained for about 10 to 60 minutes.

12. The method for fabricating a copper indium diselenide semiconductor film according to claim 1 wherein the selenide species comprise H2Se gas.

13. The method for fabricating a copper indium diselenide semiconductor film according to claim 1 wherein the sulfide species comprise H2S gas.

14. The method for fabricating a copper indium diselenide semiconductor film according to claim 1 wherein N is greater than 40.

15. The method for fabricating a copper indium diselenide semiconductor film according to claim 1 wherein each of the plurality of substrates is separated by a predetermined distance.

16. The method for fabricating a copper indium diselenide semiconductor film according to claim 1 wherein the furnace is characterized by a temperature profile having a uniformity of about less than 25 degrees Celsius.

17. The method for fabricating a copper indium diselenide semiconductor film according to claim 1 wherein each of the substrates is maintained in substantially a planar configuration free from warp or damage.

18. The method for fabricating a copper indium diselenide semiconductor film according to claim 1 wherein removing at least residual selenide species terminates a reaction to form the copper indium diselenide film.

19. The method for fabricating a copper indium diselenide semiconductor film according to claim 1 wherein the introducing of the sulfide species comprises back filling the furnace while holding the furnace at the second temperature.

20. The method for fabricating a copper indium diselenide semiconductor film according to claim 1 wherein the step of removing of residual selenide species from the furnace occurs until the furnace is in a vacuum configuration.

21. The method for fabricating a copper indium diselenide semiconductor film according to claim 1 wherein the substrates further comprise gallium material.

22. The method for fabricating a copper indium diselenide semiconductor film according to claim 1 wherein the copper and indium composite structure comprises a copper and indium alloyed material.

23. The method for fabricating a copper indium diselenide semiconductor film according to claim 1 wherein the copper and indium composite structure comprises a layer of copper material and a layer of indium material.

24. A method for fabricating a copper indium diselenide semiconductor film comprising:
   transferring a plurality of substrates into a furnace, each of the plurality of substrates provided in a vertical orientation with respect to a direction of gravity, the plurality of substrates being defined by a number N, where N is greater than 5, each of the substrates having at least a copper and indium composite structure;
   introducing a gaseous species including a selenide species and a carrier gas comprising a nitrogen species into the furnace;
   transferring thermal energy into the furnace to increase a temperature from a first temperature to a second temperature ranging from about 350 degrees Celsius to about 450 degrees Celsius to at least initiate formation of a copper indium diselenide film from the copper and indium composite structure on each of the substrates;
   selectively introducing additional carrier gas into the furnace to maintain a substantially uniform temperature profile within the furnace during transferring of the thermal energy or another process within the furnace.

25. The method for fabricating a copper indium diselenide semiconductor film according to claim 24 wherein the another process within the furnace comprises maintaining the temperature at about the second temperature for a period of time.

26. The method for fabricating a copper indium diselenide semiconductor film according to claim 24 wherein the other process within the furnace comprises removing at least residual selenide species from the furnace.

27. The method for fabricating a copper indium diselenide semiconductor film according to claim 24 wherein the other process within the furnace comprises introducing a sulfide species into the furnace.

28. The method for fabricating a copper indium diselenide semiconductor film according to claim 24 wherein the another process within the furnace comprises increasing a temperature to a third temperature, the third temperature ranging from about 500 to 525 degrees Celsius while the plurality of substrates are maintained in an environment including a sulfur species to extract at least one selenium species from the copper indium diselenide film.

29. The method for fabricating a copper indium diselenide semiconductor film according to exclaim 24 wherein the second temperature ranges from about 390 degrees Celsius to about 410 degrees Celsius.

30. The method for fabricating a copper indium diselenide semiconductor film according to claim 24 wherein the first temperature ranges from about room temperature to about 100 degrees Celsius.

31. The method for fabricating a copper indium diselenide semiconductor film according to claim 24 wherein N is greater than 40.

32. The method for fabricating a copper indium diselenide semiconductor film according to claim 25 wherein each of the substrates is maintained in substantially a planar configuration free from warp or damage from at least the selective introduction of the additional carrier gas.

33. The method for fabricating a copper indium diselenide semiconductor film according to claim 25 wherein the additional carrier gas contributes to cooling of the furnace.

34. The method for fabricating a copper indium diselenide semiconductor film according to claim 24 further comprising providing temperature sensors to monitor temperature reading at one or more zones within the furnace.

35. The method for fabricating a copper indium diselenide semiconductor film according to claim 24 further comprising providing a plurality of temperature controls, each of the temperature controls being associated with a zone within the furnace.

36. The method for fabricating a copper indium diselenide semiconductor film according to claim 24 wherein the furnace includes at least one baffle.

* * * * *